United States Patent [19]

Schröder

[11] Patent Number: 5,347,143
[45] Date of Patent: Sep. 13, 1994

[54] TUNNELLING BARRIER BETWEEN TWO NON-TUNNELLING SUPERCONDUCTOR-INSULATOR-CONTROLLING SUPERCONDUCTOR-INSULATOR-SUPERCONDUCTOR STRUCTURES

[75] Inventor: Hehrwart Schröder, Überlingen-Hödingen, Fed. Rep. of Germany

[73] Assignee: Dornier Luftfahrt GmbH, Fed. Rep. of Germany

[21] Appl. No.: 103,307

[22] Filed: Aug. 9, 1993

Related U.S. Application Data

[63] Continuation of Ser. No. 884,087, May 18, 1992, abandoned.

[30] Foreign Application Priority Data

May 17, 1991 [DE] Fed. Rep. of Germany ....... 4116120

[51] Int. Cl.$^5$ .................... H01L 39/22; H01L 39/24
[52] U.S. Cl. ........................ 505/191; 257/31; 257/36; 505/702; 505/832; 505/849; 505/848; 505/874; 505/922; 505/162; 505/181; 505/203; 250/336.2
[58] Field of Search ............ 257/30, 31, 32, 33, 257/35, 36, 37, 34; 505/700, 702, 812, 813, 817, 832, 922, 1, 874, 849, 848; 250/336.2

[56] References Cited

U.S. PATENT DOCUMENTS 3,643,237  2/1972  Anacker ............................. 257/36
4,837,604  6/1989  Faris .................................. 257/36

FOREIGN PATENT DOCUMENTS 0329507   8/1989   European Pat. Off. .
0449559A2 3/1991   European Pat. Off. .
1803953   6/1969   Fed. Rep. of Germany .
4010489  10/1991   Fed. Rep. of Germany .
248187   10/1988   Japan .
53584     3/1989   Japan .
53585     3/1989   Japan .
5580      1/1990   Japan .
114576    4/1990   Japan .

OTHER PUBLICATIONS

"Superconductive radiation detector with large sensitive area (series-connected STJ detector)," Review of Scientific Instruments, Jan. (1991), No. 1, New York.
Optical Detector Using Superconducting $BaPb_{0.7}Bi_{0.3}O_3$ thin films, NTT Electrical Communication Laboratory, Tokai, Ibaraki-ken 319-11 Japan.

Primary Examiner—Jerome Jackson
Assistant Examiner—Alice W. Tang
Attorney, Agent, or Firm—Evenson, McKeown, Edwards & Lenahan

[57]   ABSTRACT

A superconducting tunnel element, having a plurality of super conductors separated by barriers, the superconductors each comprising two physically separate but electrically connected superconducting layers and one insulated control layer. As a result, summation of the detection capacity or of the transmitting intensity becomes possible. Also, the simultaneous detection or transmission is permitted on arbitrary different frequencies or a summation of the signal intensity is possible in the case of SQUID-systems.

22 Claims, 7 Drawing Sheets

TUNNELLING BARRIER BETWEEN TWO NON-TUNNELLING SUPERCONDUCTOR-INSULATOR-CONTROLLING SUPERCONDUCTOR-INSULATOR-SUPERCONDUCTOR STRUCTURES

This application is a continuation of U.S. application Ser. No. 07/884,087, filed on May 18, 1992, now abandoned.

FIELD OF THE INVENTION

This invention relates to a superconducting tunnel element.

BACKGROUND OF THE INVENTION

Superconducting tunnel elements detect electromagnetic radiation in a manner that is more sensitive by several orders of magnitude than conventional detectors. Another important advantage is the extremely short response time of superconducting tunnel elements, which is currently in the range of picoseconds ($t_{min} \geq e \cdot \Phi_0 / DELTA$; wherein e=electron charge; $\Phi_0$=flux quantum; and DELTA=energy gap).

Superconducting tunnel elements for detection purposes have existed for approximately 25 years. Cooper pair tunnels and lone-electron tunnels (also called quasi-particle tunnels) are used in radio-astronomy for the detection of electromagnetic waves. SQUID-systems employing superconducting tunnel elements are used in medicine and research for the precision measuring of electromagnetic fields.

Superconducting tunnel elements detect electromagnetic radiation in two different modes: as a wide-band detector, and as a frequency-selective detector. As a general rule, an operating limit for tunnel elements (in terms of small wavelengths) is determined by the energy gap in the excitation spectrum of the superconductor material. The energy gap in turn is a function of the temperature, and theoretically reaches its maximum at T=O. This means that with lower temperatures, the short-wave operating limit is shifted continuously farther in the direction of smaller wavelengths.

Because of the dependency of the response time and the switching time on the energy gap, these times are also continuously reduced with a decreasing temperature. Furthermore, as the temperature decreases, the noise temperature is reduced and sensitivity is increased. The value of the energy gap may be controlled, for example, by means of a current loop, between the values of the material-specific and temperature-dependent maximum down to zero. Therefore any spectrum can be adjusted starting from the short-wave limit as shown from German Patent Document DE-OS 18 03 953.

The basic structure of a tunnel element consists of two or more layers of superconductor material separated by a barrier. Two different tunnel effects may be utilized for the detection of electromagnetic radiation, with the thickness of the barrier determining the type of the effect, as discussed hereinafter. In the case of barrier thicknesses of more than 1.5 nm to approximately 3 nm, only lone electrons can still tunnel. Cooper pairs, on the other hand, tunnel at thicknesses of around 1 to 1.5 nm.

Much development work has been done recently in the field of superconducting tunnel elements and their applications, as evidenced by the following:

Series connections with more than 1,000 Josephson tunnel elements have been manufactured and studied. (J. Niemeyer and J. H. Hinken, *Mikrowellen Magazin*, Vol. 13, No. 2, 1987, Page 118).

European Patent Document EP 329 507 A1, discloses a superconducting tunnel element in which a plurality of superconducting tunnel layers and insulating layers are stacked on one another. The layers have thicknesses of only a few atomic layers (Column 3, Line 58) and may be applied by means of molecular beam epitaxy (Column 4, Line 20). Electrical connections (for example, for control voltages) within the individual layers of the stack are not disclosed.

The U.S. Journal *J. App. Phys.* 59(11), 1986, Page 3807, discloses an optical detector with a superconducting oxide layer.

From *Patent Abstracts of Japan* of the Japanese Patent Document JP 63-248187 (A) a stack of superconducting and normally conducting thin films is known.

From *Patent Abstracts of Japan* of the Japanese Patent Documents JP 02-5580 (A) and JP 2-114576 (A), superconducting optical detectors are known, in which several superconducting layers and insulating layers are stacked on one another.

*Patent Abstracts of Japan*, Japanese Patent Documents JP 01-53584 (A) and JP 01-53585 (A), disclose analog/digital converters which consist of stacks of superconducting layers of different sizes which are separated by insulating layers.

U.S. Pat. No. 4,837,604, discloses a superconducting switch with a stack of superconducting layers in which the control current is fed to a layer situated in the stack.

In German Patent Document DE 40 10 489 A1, a superconducting tunnel element is used to provide a sensor and a transmitter in which the frequency range can be adjusted. This tunnel element also detects electromagnetic radiation only in the long-wave spectral region which lies above a short-wave limit which corresponds energetically to the respective value of the energy gap. As noted previously, the value of the energy gap, in the case of the tunnel elements, can be controlled between the values of the material-specific and temperature-dependent maximum to zero.

SUMMARY OF THE INVENTION

It is an object of the present invention to provide a superconducting tunnel element having improved controllability such that, among other things, the detection capacity in the detection mode, and the radiation intensity in the transmitting mode, are increased substantially over that of previous devices.

This and other objects and advantages are achieved according to the invention, in which respective superconductor structures comprise integrated insulated control layers. In one embodiment of the invention, the number of barriers and superconductor structures is increased so that the layers are "stacked". The numbers of superconductor structures may differ from one application to the next. Thus, the number of barriers can be adjusted arbitrarily between 3, 4 or 5 (particularly above 10), up to over 1,000.

A tunneling element, according to the present invention, is constructed to include a layer sequence comprising superconducting structures and insulating barriers arranged on a substrate base plate. The base plate is compatible, with respect to the lattice constant, with the material used. A superconducting control layer of material is built into each superconductor structure—again in an insulating manner. A superconductor structure (or tunnel cell, $SL_1$, in FIG. 1) according to the invention therefore has the following construction: Superconducting layer $S_1$—insulator I—superconducting layer $S_2$ for control—insulator I—superconductor $S_3$. The tunnel cell is then followed by the barrier B and the next superconductor structure or tunnel cell $SL_2$. This can also again be followed by a barrier $B_2$ and then by another superconductor structure or tunnel cell of the same type, etc.

The number of superconductor structures or tunnel cells in a tunnel system is a function of the manufacturing possibilities and of the purpose of the application. It may be large. Each superconductor structure is separated from the next one by a defined barrier. For this reason, there are many tunnel barriers in this tunnel contact.

The superconducting layers must be as thin as possible while still retaining the capacity to superconduct (for example, in the case of high-temperature superconductor layers, on the order of nm). The insulating layers on the flanks of the control superconductor layers, on the other hand, must prevent the tunneling and therefore preferably have a thickness of about 5 nm.

The barriers must meet the highest requirements. They must all be closed (tight), and must have a thickness of about 1 to 1.5 nm.

Because the layer sequence facing the radiation must meet the requirement of the optically thin layer, the superconducting layers must be much smaller than the wavelength of the radiation that is to be used. The superconducting layers must reach at least the thickness of the material-specific coherence length. This means that the whole stack has a thickness on the order of microns. Because of the very thin layers, the whole stack itself is only a thin foil.

As in the case of an individual tunnel element, each superconductor structure has one connection for the voltage supply and one for the signal current, allowing all combinations with the component. In order to be able to control the energy gap for each layer, a current loop, consisting of a superconducting foil insulated with respect to the environment, must be placed in each superconducting structure. Two opposite flanks of the tunnel stack should preferably remain free of all bondings.

A tunnel component having several superconducting structures operates in accordance with the following method. As in the case of a series connection, the voltage of each of the respective superconductor structures is additive, the original energy gap voltage of 2 DELTA being fed between each superconductor structure pair. If, corresponding to the resulting contact potential, the tunnel switching is biased to a point just before the rise of the characteristic curve, detection takes place in all barriers. In the case of a slightly higher bias in the transmitting mode, transmitting takes place in all barriers.

The specifications for the tunnel component comprising several superconductors are known from the German Patent Document DE 40 10 489 A1. In contrast to the single tunnel element, the multiple tunnel component or element in a stack according to the present invention offers, among others, the following clear advantages:

The mainly uniform fields in each superconducting layer due to the new layer sequence of the tunnel cells in a stack, permit an individual uniform control of the energy gap in each superconducting layer, and arbitrary combinations of all possible circuits. As a result, the stacked multiple tunnel element becomes a superior instrument.

The most important advantages of the new tunnel component with respect to the previous tunnel elements are the following:

Uniform Fields in Each Superconducting Layer

Previous tunnel elements have operated with a control layer at one end of the tunnel element. Thus, uniform control is not possible even in the case of a single tunnel element. The new layer sequence, however, operates with superconducting control layers in each superconducting structure. The current-induced fields flow uniformly through each superconducting structure from the direction of the center, which is a prerequisite for the full controlling capacity of the stack.

Summation of the Detector Capacity

When the operating voltage meets the requirement of the detection mode (working voltage smaller than 2 DELTA), and all superconductor structures are controlled by identical energy gaps, the detection capacity (minus the noise power), which increases by a factor of approximately the square root of two for each layer, will add up with each superconductor structure.

Simultaneous Detecting of Different Frequencies

When N=the number of superconducting structure pairs, different frequencies are detected simultaneously in detection mode N if each structure pair has different energy gaps. The N different frequencies can be adjusted individually.

Summation of the Radiation Intensity

When the operating voltage meets the requirement for the transmitting mode (operating voltage larger than 2 DELTA), and all structures are controlled by identical energy gaps, the radiation intensity will add up with each layer.

Simultaneous Transmitting on Different Frequencies

When N=number of superconductor structure pairs, different frequencies are transmitted simultaneously in the transmitting mode n if each structure pair has different energy gaps. The N different frequencies may be adjusted individually.

Combination of Arbitrary Frequencies

Since every structure and every structure pair can be controlled individually, the option of arbitrary combinations exists, in addition to the "all structures identical or all structures different" energy gaps options. Thus, for example, several structure pairs may be bundled for desired selected frequencies.

Construction of Highly Sensitive SQUID-Systems

For the use in SQUID-systems, the individually controllable structure pairs must be controlled such that all structures in the stack operate at the same energy gap. As a result, the output signal of the SQUID-systems will increase by several orders of magnitude. The sensitivity is clearly improved by the stack arrangement.

Manufacturing and Bonding

Manufacturing and bonding of the superconducting tunnel element according to the invention is carried out by means of the known process referred to as molecular beam epitaxy. (See, for example, German Patent Document DE 40 10 489 A1.) In this case, the whole sensor cell, including the contact paths for the bonding connections, is created in the molecular beam epitaxy facility. Bonding is achieved by the method of recursive overlapping during layer synthesis. For this purpose, the required number of contacts is made available on the substrate plate.

Since the component surface has dimensions of a millimeter magnitude, but the contact paths become smaller than a micron, the geometry of the layers may be adapted to the number of required contacts in steps; for example, by means of microtemplates.

For high-temperature superconductors, the coherence length is much smaller than for classical superconductors. It is thus important that the superconducting layers be made only as thick as necessary. (The minimum dimensions of a superconductor must be equal to the coherence length, because no superconducting will otherwise be possible).

Other objects, advantages and novel features of the present invention will become apparent from the following detailed description of the invention when considered in conjunction with the accompanying drawings.

DETAILED DESCRIPTION OF THE DRAWINGS

Figure 1:
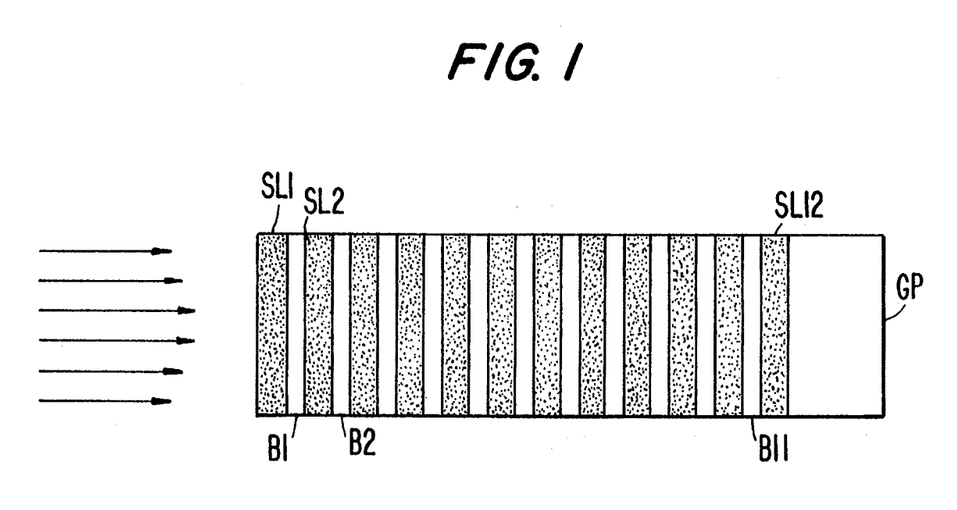
FIG. 1 is a schematic representation of tunnel elements according to the invention in a multiple tunnel element stack.

FIG. 1 is a schematic representation of a superconducting multiple tunnel element arrangement according to the present invention in which twelve superconducting structures or tunnel cells $SL_1$ to $SL_{12}$, separated by eleven barriers $B_1$, $B_2$, etc., are applied to a substrate base plate GP. (Electrical connections are not shown.) On the left side, which is away from the substrate base plate GP, the radiation enters in the case of sensor operation or exits in the case of an operation as a radiation source. In this instance, the thicknesses of the barriers $B_N$ are at 1 to 1.5 nm; those of the superconducting structures $SL_N$ must correspond at least to the coherence length of the layers of superconductor material (depending on the material). The coherence length is the shortest length along which the Cooper pair density may vary.

Figure 2:
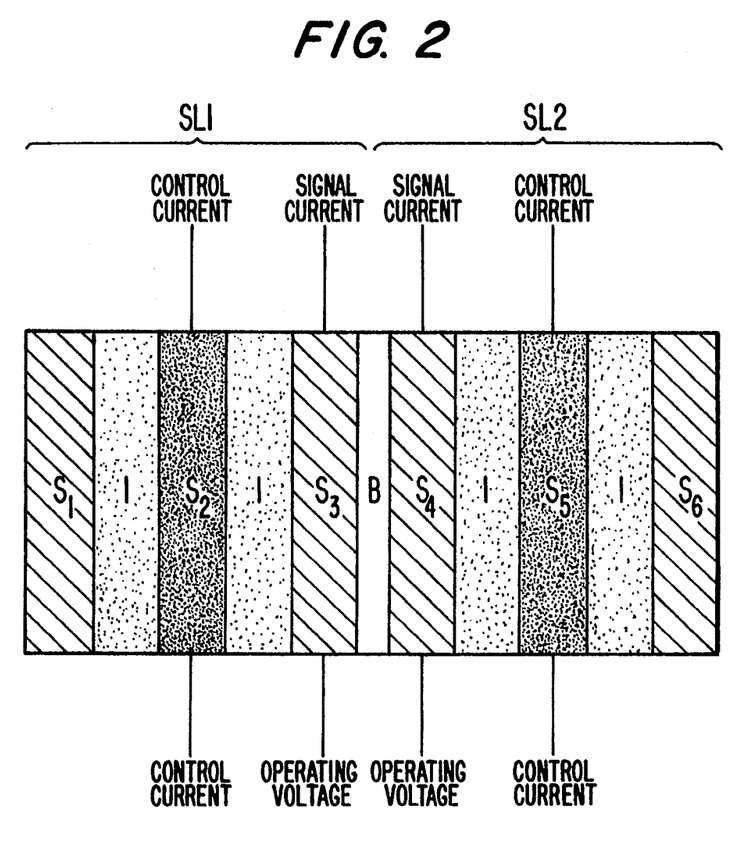
FIG. 2 is a view of a detail of FIG. 1 showing a single tunnel element.

FIG. 2 is a detailed illustration of the construction of a tunnel element having two superconductor structures $SL_1$ and $SL_2$ of FIG. 1, separated by barrier layer B. Each of the superconductor structures $SL_1$ and $SL_2$ is bounded by two superconducting layers $S_1$, $S_3$ and $S_4$, $S_6$, respectively), and each has in its center one layer of superconducting control film ($S_2$, $S_5$ respectively). The control films $S_2$ and $S_5$ are insulated via insulating layers I with respect to the remaining superconducting environment. A control current is fed to the control layers $S_2$, $S_5$, connections for the operating voltage and for the signal current being provided on the superconducting layers (in this case, $S_3$ and $S_4$).

Figure 3:
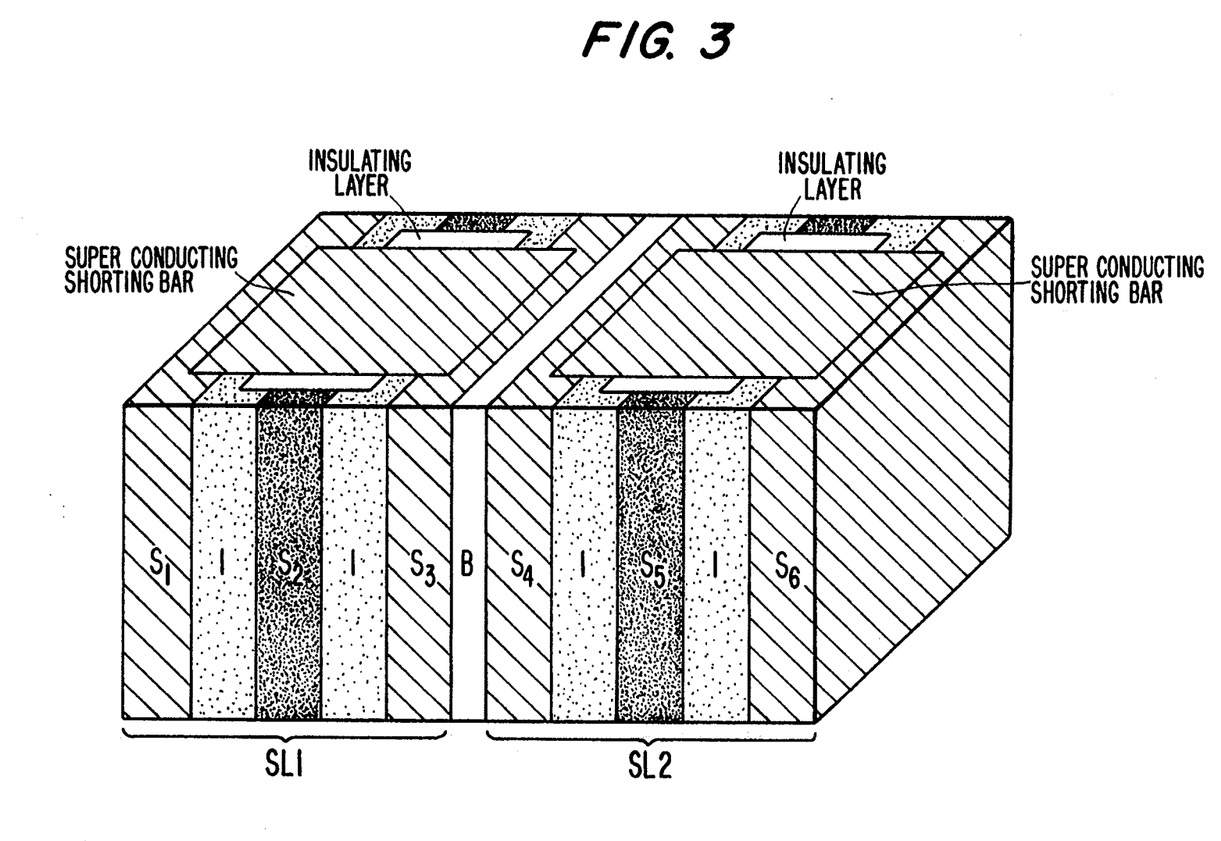
FIG. 3 is a view of a superconductor tunnel element, as it can be used in accordance with the invention.
Figure 4:
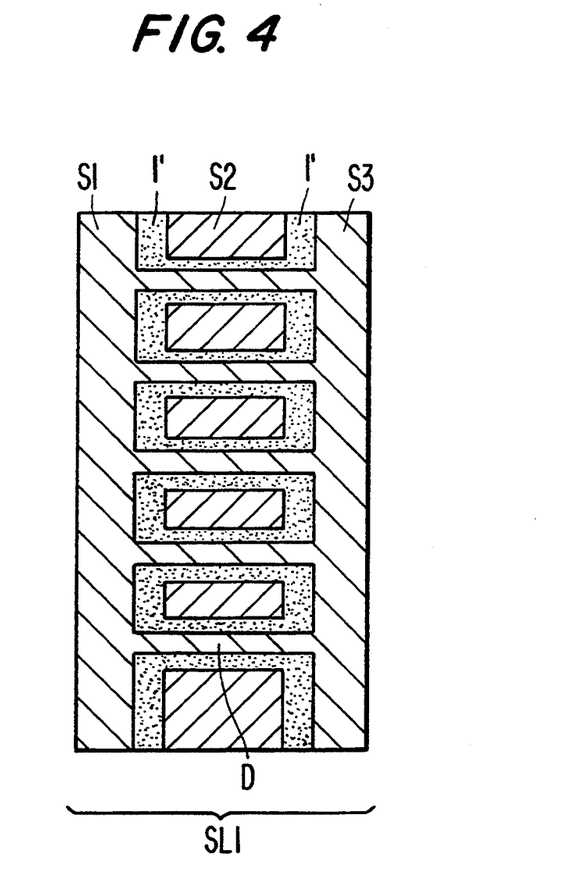
FIG. 4 is a view of another embodiment of a superconducting tunnel element, as it can be used in accordance with the invention.

The control layer exists in every superconductor structure SL for the control of a uniform field. The control layers (control films) $S_2$, $S_5$ may either be of a sieve type or the adjoining superconducting layers $S_1$, $S_3$ must be short-circuited on the flanks (see FIG. 3, $S_1$ with $S_3$, and $S_4$ with $S_6$). According to these two methods, the individual layers $S_1$ and $S_3$ are physically separate, but electrically connected with one another, as shown in FIGS. 3 and 4. The insulators I have a thickness $> 5$ nm.

FIG. 3 illustrates the superconducting short-circuit paths on the flanks of the tunnel element. The two superconductor structures $SL_1$ and $SL_2$ are separated by the barrier B. The layers $S_1$ and $S_3$ or $S_4$ and $S_6$, are separated from one another, but electrically short-circuited on the flanks by means of superconducting shorting bars. In this case, the shorting bars are electrically insulated (insulating layers on the flanks) from the control layers $S_2$ and $S_5$.

FIG. 4 shows another embodiment of the superconductor structure $SL_1$, in which the electrical connection of the individual superconducting layers $S_1$ and $S_3$ takes place by way of through connections D. As a result, the control layer $S_2$ becomes perforated or of a sieve type. The through-connections D are also superconducting, preferably made of the same material as the layers $S_1$ and $S_3$, and are electrically insulated (insulations I') from the control layer $S_2$.

Figure 5:
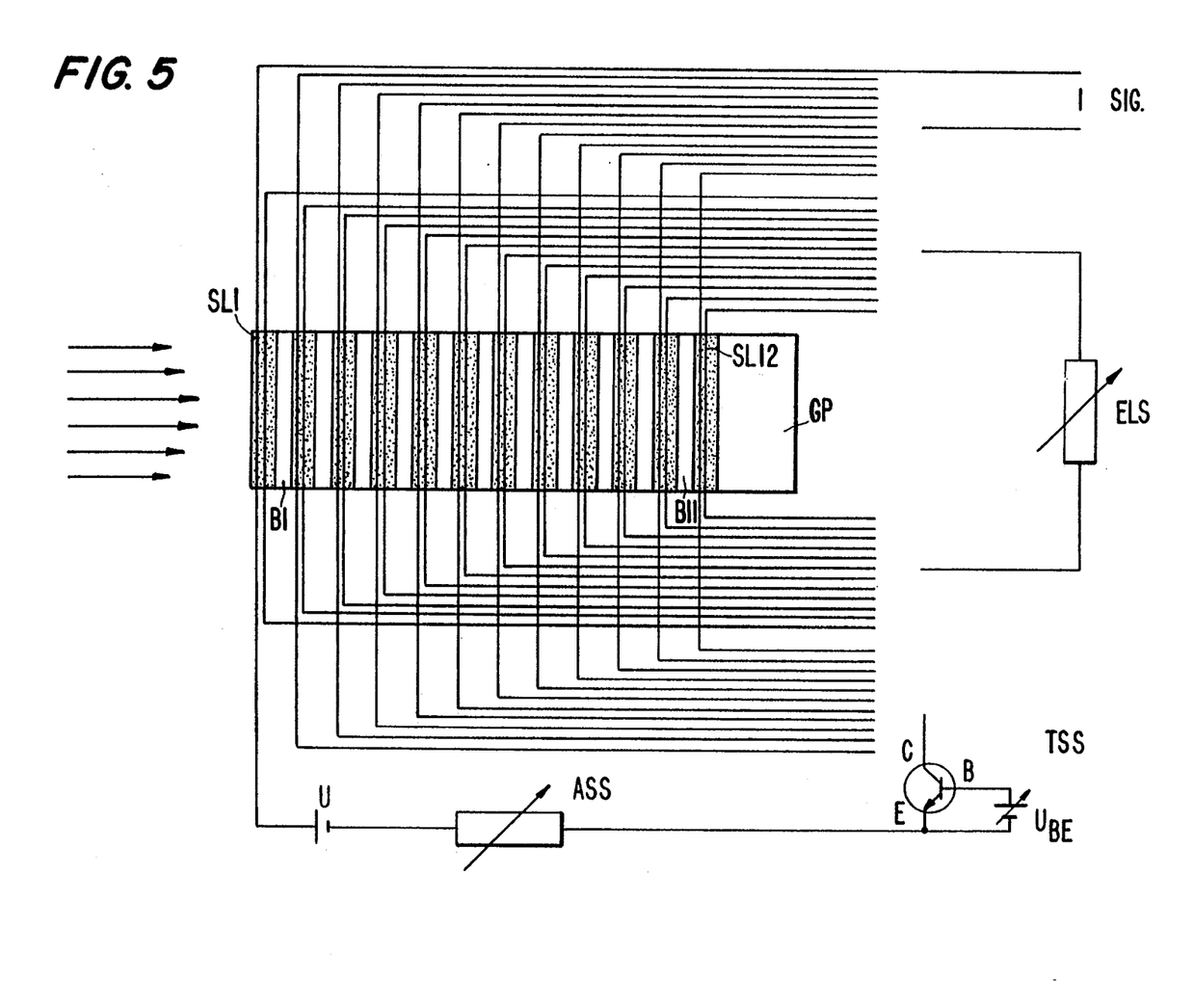
FIG. 5 is a wiring diagram of a multiple tunnel element according to the invention.

FIG. 5 shows a wiring diagram of a superconducting multiple tunnel element arrangement according to the invention, with twelve superconductor structures $SL_1$ to $SL_{12}$ separated by eleven barriers $B_1$ to $B_{11}$, on a base plate GP. Each of the individual superconducting structures $SL_N$ has lateral connections, as illustrated in FIG. 2, by means of which they may be activated or deactivated so that the resulting tunnel voltages may be adjusted arbitrarily (tunnel voltage control TSS). Also shown is the current loop ELS which permits electromagnetic auxiliary control of the individual energy gaps. The operating voltage control ASS is also shown. The direction of incidence of the radiation during sensor operation is indicated by the arrows on the left. During operation as a radiation source, the radiation emerges on the left.

Therefore, each superconductor structure $SL_N$ has the following four connections in this embodiment: Two for the operating voltage and the signal current TSS, $I_{sig}$, respectively, and two for the current loop ELS for the energy gap control.

The multiple tunnel component is controlled as follows.

Adjusting of the Operating Mode

Whether the device operates in the detecting, parametrically amplifying or transmitting operating mode is determined by the operating voltage, which is adjusted by means of a precision voltage source.

Control of the Intensity in Steps and Continuously

Control of the intensity takes place in the non-linear part of the characteristic current-voltage curve by controlling the tunnel current in a continuous manner, and by switching-off the individual superconductor structures $SL_N$ in steps.

The intensity (transmitting mode) or the detection capacity may be controlled by (superconducting) switches (Josephson element with control layer) in steps between the superconducting structures $SL_N$ to be shut-down. This may take place, for example, on the exterior surfaces for a connecting or disconnecting. The (superconducting) switches may be activated or deactivated as required by means of a computer.

On its interior, the tunnel wiring must not be interrupted by shut-down superconducting structures $SL_N$.

Continuous control of the intensity may take place by controlling the tunnel current. Until superconducting components are used, a transistor circuit, for example, connected in series with the precision voltage source, can be used for this purpose.

In the linear part of the characteristic current—voltage curve, a linear resistor should control the operating voltage. In the non-linear area of the characteristic curves, the operating voltage changes very little, but the tunnel current rises steeply. Because of the non-linear characteristic-curve fields of the transistor, a suitable control element can therefore be implemented for continuous control of the tunnel current.

Electromagnetic Control of the Energy Gap

The energy gaps in the individual superconducting structures $SL_N$ can be controlled (from zero to the maximum) uniformly or individually by electromagnetic fields generated by a superconducting control loop ELS.

If all combinations of the component are to be permitted, it is necessary to equip all superconductor structures $SL_N$ individually with a special electric network. In the center of each structure, this electric network must be such that an approximately uniform field can affect the superconducting layers. Two possible solutions are shown in FIGS. 3 and 4 (shorting bars or sievetype insulated superconducting layer in the center of the superconducting structures $S_N$,

Computer Control

The above-mentioned functions of this multiple-tunnel element arrangement may be regulated and controlled by a specially programmed computer.

Figure 6:
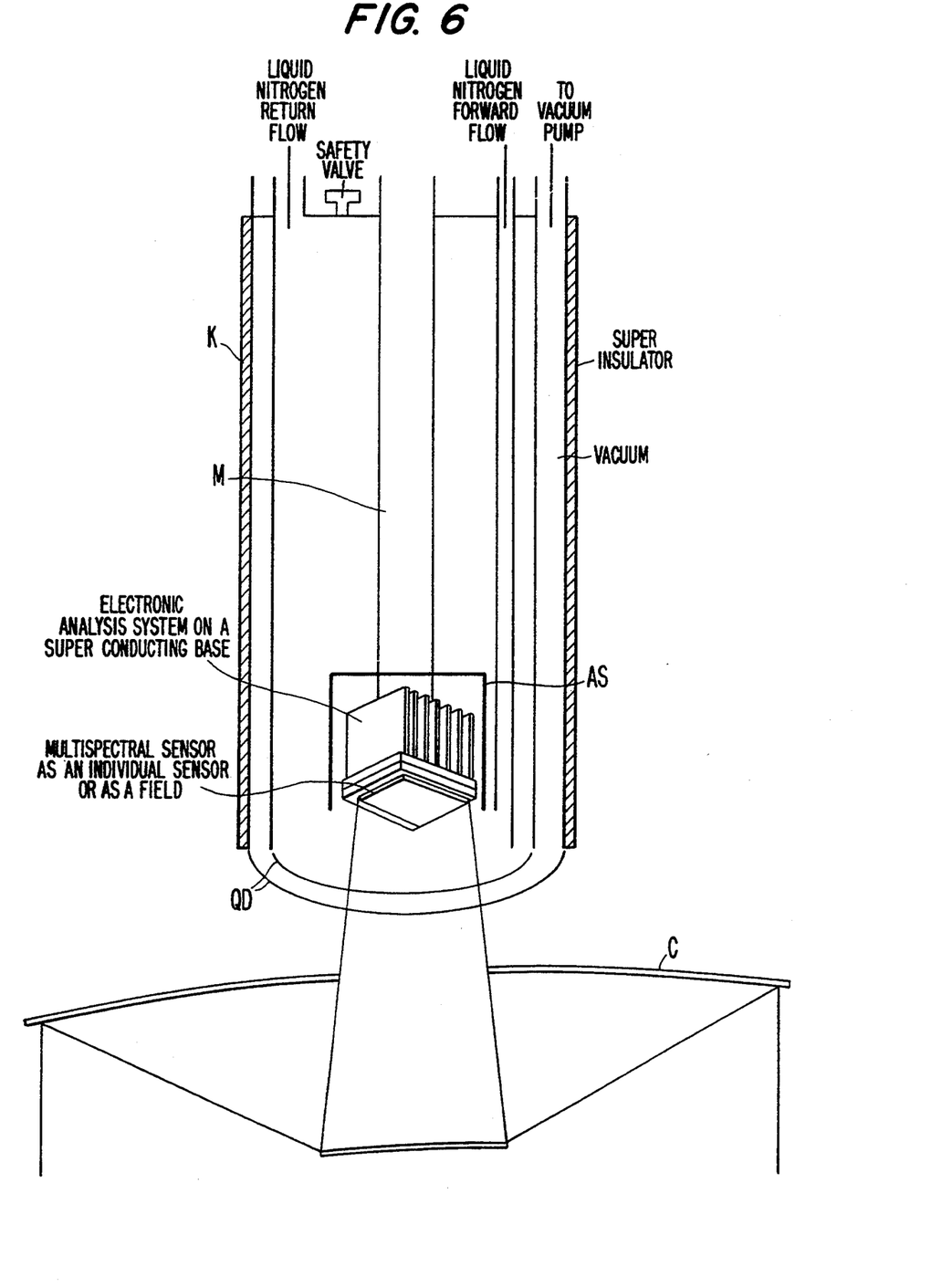
FIG. 6 is a schematic view of a multispectral transmitting and receiving system in a Cassegrain mirror.

FIG. 6 shows the diagram of a multispectral transmitting and receiving system and the electronic control and analysis system used in conjunction with a Cassegrain mirror C. The sensor (which is constructed either as an individual sensor or is composed of sensor elements), and the electronic control analysis system are situated in the cryostatic temperature regulator K at the focal point of the Cassegrain mirror C. The sensor array is composed of multiple tunnel elements arranged next to one another in a matrix, with the respective structures which absorb the light (SL1 in FIG. 1) directed downward to receive the light to be detected, by way of the mirror C. The cryostatic temperature regulator K comprises a super insulation layer, a vacuum connection, an inflow and a return flow for liquid nitrogen, a safety valve, an assembly holder M with the control and signal lines, shielding AS on the superconduction base and a quartz dome QD, as shown in FIG. 6. In this miniaturized cryostatic temperature regulator K, it is ensured that all superconducting parts remain in the liquid nitrogen in any position in space. The safety valves, the superinsulation and impeded inflow and outflow are important parts. Microwave radiation falls on the sensor array through the dome QD. Thus, the miniaturized cryostatic temperature regulator K may be constructed to be swivelling, whereby the sensor can be directed into arbitrary directions.

For many applications, this "liquid nitrogen version" will be sufficient. For extreme demands, an expansion may take place by means of a cryostatic helium temperature regulator, which is not shown. This regulator will then operate with an additional radiation shield of liquid nitrogen.

Additional applications of the multiple tunnel element component according to the invention are as follows. The following abbreviated listing provides an idea of the interesting possibilities which this multiple tunnel element component offers with its flexibility:

Analysis of Signals—Because of its very high time resolution and its extreme sensitivity, a precision analysis is possible for the whole electromagnetic spectrum;

Identification of Signal Sources—Signal sources have characteristic patterns which, after comparison with an emitter catalog, can be identified in the computer;

Radar engineering with free selection of the spectral region, starting from a short-wave limit in the direction of the long-wave region;

Passive target recognition and tracking starting from a short-wave limit in the direction of the long-wave region; and Radar for nondestructive testing.

Because the absorption of RF radiation depends on its frequency, radio radiation penetrates, for example, several meters of soil and partly penetrates clouds of dust. The application of the principle of frequency-dependent absorption, coupled with a high sensitivity in the most important region of the electromagnetic spectrum, leads, for example, to the following further applications:

Passive Locating of Targets—Finding accident victims or missing persons under debris, water, snow, vehicles, ships after accidents, etc;

Promoting Imaging Processes in Infrared—(For the fields of medicine and materials testing). High-contrast images in the IR-range are possible because of the passing through a respective optimal spectrum;

Different spectral regions render different layers visible;

Diagnostic support in the field of medicine by means of noninvasive procedures. The molecules to be analyzed are caused to rotate, for example, by means of microwaves. In many cases, a rotational transition is sufficient due to the narrow line width ($\approx 10$ kHz). That is, there is hardly any overlap in the response of different substances. It is thus possible, for example by targeted pulsed radiation of the superconducting multiple tunnel element component for a period of approximately 1 $\mu s$ at a frequency which approximates that of the rotational transition to be observed, to excite all types of substances and compounds so that they then emit their own rotational spectrum. The emission signals, which decay with respect to time, can then be scanned at intervals of a few (10) ns and be processed for each computer. (The rotational spectrums of more than 1,500 compounds are documented in literature).

Applications for the Combination of Arbitrary Frequencies;

Macromolecules can be destroyed more easily if they are irradiated in a targeted manner simultaneously with radiation having only those IR-frequencies at which the partial molecules resonate.

Multispectral sensor and transmitting technology is particularly suitable for electronic warfare;

Applications for the construction of highly sensitive SQUID-systems—When the tunnel elements according to the invention are used, the signal intensifies by several orders magnitude, specifically by the number of superconducting structures N. (This is true when all structures $SL_N$ operate on precisely the same energy gap.)

Figure 7:
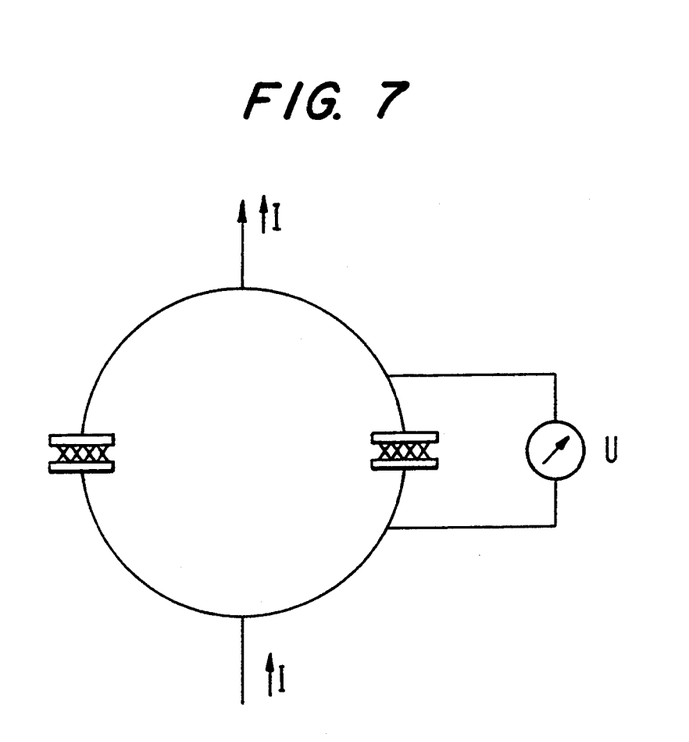
FIG. 7 is a schematic diagram of an improved SQUID system according to the invention.

FIG. 7 is a schematic diagram of an improved SQUID system embodying the principles of the invention. Two Josephson diodes form a ring in which a superconductivity current is induced. This current modulates the Josephson current $I_c$ induced in the tunnel elements with the period $\Phi_0 = K/2e$.

k = Planck constant
e = electron charge
$\Phi_0$ = flux quantum

When a voltage u occurs between two rings halves, the current $I_c$ will flow. In this arrangement, the tunnel diodes of prior art devices are replaced by the stack in order, among other things, to multiply the induction surface in the tunnel elements. This applies to all SQUID types.

Although the invention has been described and illustrated in detail, it is to be clearly understood that the same is by way of illustration and example, and is not to be taken by way of limitation. The spirit and scope of the present invention are to be limited only by the terms of the appended claims.

I claim:

1. A controllable superconductor structure, comprising:
    a first superconducting layer of material;
    a second superconducting layer of material substantially parallel to and electrically connected with said first superconducting layer; and
    a control superconducting layer of material formed between and electrically insulated from said first and second layers, said superconducting control layer having inputs to receive a variable control current for controlling the controllable superconductor structure.

2. A controllable superconductor structure according to claim 1, wherein said first and second superconducting layers are electrically connected with one another by one of:
    a third superconducting layer of material, functioning as a shorting bar, arranged adjacent and substantially transverse to said first, second and control superconducting layers, said third superconducting layer being electrically connected with said first and second layers and electrically insulated from said control superconducting layer; and
    at least one superconducting through-connection extending between said first and second layers and through said control superconducting layer, said at least one through-connection being electrically connected to said first and second layers and being electrically insulated from said control superconducting layer such that said control superconducting layer has a perforated structure.

3. A controllable superconductor structure according to claim 1, wherein a barrier layer is provided between two of said controllable superconductor structures, said barrier layer having a thickness for electron tunneling of approximately 3 nm and a thickness for Josephson tunneling of approximately 1 to 1.5 nm.

4. A controllable superconductor structure according to claim 2, wherein a barrier layer is provided between two of said controllable superconductor structures, said barrier layer having a thickness for electron tunneling of approximately 3 nm and a thickness for Josephson tunneling of approximately 1 to 1.5 nm.

5. A controllable superconducting structure according to claim 1, wherein said barrier layer is a molecular beam epitaxially formed barrier layer.

6. A controllable superconducting structure according to claim 2, wherein said barrier layer is a molecular beam epitaxially formed barrier layer.

7. A controllable superconducting structure according to claim 3, wherein said barrier layer is a molecular beam epitaxially formed barrier layer.

8. A multiple-tunnel element arrangement, comprising:
    at least three controllable superconductor structures arranged parallel to one another and adjacent to barrier layers formed between each of said controllable superconductor structures;
    wherein each of said controllable superconductor structures includes:
    a first superconducting layer of material;
    a second superconducting layer of material substantially parallel to and electrically connected with said first superconducting layer; and
    a control superconducting layer of material formed between and electrically insulated from said first and second layers, said superconducting control layer having inputs to receive a variable control current for controlling the controllable superconductor structure.

9. A multiple-tunnel element arrangement according to claim 8, wherein said first and second superconducting layers are electrically connected with one another by one of:
    a third superconducting layer of material, functioning as a shorting bar, arranged adjacent and substantially transverse to said first, second and control superconducting layers, said third superconducting layer being electrically connected with said first and second layers and electrically insulated from said control superconducting layer; and
    at least one superconducting through-connection extending between said first and second layers and through said control superconducting layer, said at least one through-connection being electrically connected to said first and second layers and being electrically insulated from said control superconducting layer such that said control superconducting layer has a perforated structure.

10. A multiple-tunnel element arrangement according to claim 8, wherein said barrier layer has a thickness for electron tunneling of approximately 3 nm and a thickness for Josephson tunneling of approximately 1 to 1.5 nm.

11. A multiple-tunnel element arrangement according to claim 9, wherein said barrier layer has a thickness for electron tunneling of approximately 3 nm and a thickness for Josephson tunneling of approximately 1 to 1.5 nm.

12. A multiple-tunnel element arrangement according to claim 8, wherein said barrier layer is a molecular beam epitaxially formed barrier layer.

13. A multiple-tunnel element arrangement according to claim 9, wherein said barrier layer is a molecular beam epitaxially formed barrier layer.

14. A multiple-tunnel element arrangement according to claim 10, wherein said barrier layer is a molecular beam epitaxially formed barrier layer.

15. Apparatus for sensing and emitting electromagnetic radiation having an arbitrary wavelength, comprising:
- a plurality of controllable superconductor structures arranged parallel to one another and adjacent to barrier layers formed between each of said controllable superconductor structures,
- wherein each of said controllable superconductor structures includes:
- a first superconducting layer of material;
- a second superconducting layer of material substantially parallel to and electrically connected with said first superconducting layer; and
- a control superconducting layer of material formed between and electrically insulated from said first and second layers, said superconducting control layer having inputs to receive a variable control current for controlling the controllable superconductor structure.

16. Apparatus according to claim 15, wherein said plurality of controllable superconductor structures includes at least three controllable superconductor structures stacked above one another.

17. Apparatus according to claim 15, wherein said first and second superconducting layers are electrically connected with one another by one of:
- a third superconducting layer of material, functioning as a shorting bar, arranged adjacent and substantially transverse to said first, second and control superconducting layers, said third superconducting layer being electrically connected with said first and second layers and electrically insulated from said control superconducting layer; and
- at least one superconducting through-connection extending between said first and second layers and through said control superconducting layer, said at least one through-connection being electrically connected to said first and second layers and being electrically insulated from said control superconducting layer such that said control superconducting layer has a perforated structure.

18. Apparatus capable of transmitting and receiving acoustic waves, comprising:
- a plurality of controllable superconductor structures arranged parallel to one another and adjacent to barrier layers formed between each of said controllable superconductor structures,
- wherein each of said controllable superconductor structures includes:
- a first superconducting layer of material;
- a second superconducting layer of material substantially parallel to and electrically connected with said first superconducting layer; and
- a control superconducting layer of material formed between and electrically insulated from said first and second layers, said superconducting control layer having inputs to receive a variable control current for controlling the controllable superconductor structure.

19. Apparatus according to claim 18, wherein said plurality of controllable superconductor structures includes at least three controllable superconductor structures stacked above one another.

20. A superconducting component for SQUIDs, comprising:
- a plurality of controllable superconductor structures arranged parallel to one another and adjacent to barrier layers formed between each of said controllable superconductor structures,
- wherein each of said controllable superconductor structures includes:
- a first superconducting layer of material;
- a second superconducting layer of material substantially parallel to and electrically connected with said first superconducting layer; and
- a control superconducting layer of material formed between and electrically insulated from said first and second layers, said superconducting control layer having inputs to receive a variable control current for controlling the controllable superconductor structure.

21. A component according to claim 20, wherein said plurality of controllable superconductor structures includes at least three controllable superconductor structures stacked above one another.

22. A component according to claim 20, wherein said first and second superconducting layers are electrically connected with one another by one of:
- a third superconducting layer of material, functioning as a shorting bar, arranged adjacent and substantially transverse to said first, second and control superconducting layers, said third superconducting layer being electrically connected with said first and second layers and electrically insulated from said control superconducting layer; and
- at least one superconducting through-connection extending between said first and second layers and through said control superconducting layer, said at least one through-connection being electrically connected to said first and second layers and being electrically insulated from said control superconducting layer such that said control superconducting layer has a perforated structure.

* * * * *